United States Patent [19]

Burress

US005238550A

[11] Patent Number: 5,238,550

[45] Date of Patent: Aug. 24, 1993

[54] ELECTROPLATING PROCESS

[75] Inventor: Jeffrey P. Burress, Framingham, Mass.

[73] Assignee: Shipley Company Inc., Marlborough, Mass.

[21] Appl. No.: 798,754

[22] Filed: Nov. 27, 1991

[51] Int. Cl.$^5$ ................................................ C25D 5/54
[52] U.S. Cl. ................................. 205/187; 205/167; 205/126; 427/304
[58] Field of Search ............... 205/187, 126, 167; 427/304

[56] References Cited

U.S. PATENT DOCUMENTS

| 844,304 | 2/1907 | Daly | 205/183 |
|---|---|---|---|
| 3,011,920 | 12/1961 | Shipley, Jr. | 427/304 |
| 3,099,608 | 7/1963 | Radovsky et al. | 205/205 |
| 3,533,918 | 4/1967 | Smith | 205/183 |
| 3,874,882 | 4/1975 | Gulla et al. | 106/1.11 |
| 3,904,792 | 9/1975 | Gulla et al. | 427/304 |
| 4,919,768 | 4/1990 | Bladon | 205/183 |
| 4,952,286 | 8/1990 | Bladon et al. | 205/920 |
| 5,007,990 | 4/1991 | Bladon | 205/183 |

Primary Examiner—John Niebling
Assistant Examiner—Kishor Mayekar
Attorney, Agent, or Firm—Robert L. Goldberg

[57] ABSTRACT

A process and composition for preparing a nonconducting surface for electroplating. The process comprises contact of the nonconductor with a reaction product of a stannous salt, a noble metal salt and halide ions in acidic solution having a pH not exceeding 3.5. The noble metal salt is present in a amount of from 0.01 and 2.5 grams per liter. The weight ratio of tin to noble metal preferably varies between 150:1 to 700:1. Following contact with the tin-noble metal composition, the surface is contacted with a solution of a sulfur salt able to react with tin and the noble metal to form a sulfide and then electroplated.

25 Claims, No Drawings

ELECTROPLATING PROCESS

BACKGROUND OF THE INVENTION

Introduction

This invention relates to a process for electroplating the surface of a nonconductor by converting an adsorbed colloid into a chemically resistant, metal sulfide conversion coating, which functions as a base for direct electroplating.

II. Description of the Prior Art

Nonconductive surfaces are conventionally metallized by a sequence of steps comprising catalysis of the surface of the nonconductor followed by contact of the catalyzed surface with an electroless plating solution that deposits metal over the catalyzed surface in the absence of an external source of electricity. Following electroless metal deposition, the electroless metal deposit is optionally enhanced by electrodeposition of a metal over the electroless metal coating to a desired full thickness.

Catalyst compositions used for electroless metal plating are known in the art and disclosed in numerous publications including U.S. Pat. No. 3,011,920. The catalysts of this patent consist of an aqueous suspension of a tin-noble or precious (catalytic) metal colloid. Electroless plating solutions are aqueous solutions containing dissolved metal and reducing agent in solution. The presence of dissolved metal and reducing agent together in plate out of metal in contact with a catalytic metal-tin catalyst. However, the presence of the dissolved metal and reducing agent together in electroless plating solution can also result in solution instability and indiscriminate deposition of metal on the walls of containers for such plating solutions.

Attempts have been made to avoid the need for an electroless plating solution by a direct plating process whereby a metal may be deposited directly over a treated nonconductive surface. One such process is disclosed in U.S. Pat. No. 3,099,608, incorporated herein by reference. The process disclosed in this patent involves treatment of the nonconductive surface with a tin palladium colloid. This is the same tin palladium colloid used as a plating catalyst for electroless metal deposition. It is possible to electroplate directly over the catalyzed surface of the nonconductor from an electroplating solution though deposition occurs by propagation from a conductive surface with deposition beginning at the interface of a conductive surface and the catalyzed nonconductive surface. The deposit grows epitaxially along the catalyzed surface from this interface. For this reason, metal deposition onto the substrate using this process is slow.

An improvement in the process of U.S. Pat. No. 3,099,608 is disclosed in U.K. Patent No. 2,123,036B. In accordance with the process described in this patent, a surface is provided with metallic sites and the surface is then electroplated from an electroplating solution containing an additive that is said to inhibit deposition of metal on the metal surface formed by plating without inhibiting deposition on the metallic sites over the nonconductive surface. In this way, there is said to be preferential deposition over the metallic sites with a concomitant increase in the overall plating rate. In accordance with the patent, the metallic sites are preferably formed in the same manner as in the aforesaid U.S. Pat. No. 3,099,608—i.e., by immersion of the nonconductive surface in a solution of a tin palladium colloid. The additive in the electroplating solution responsible for inhibiting deposition is described as one selected from the group of dyes, surfactants, chelating agents, brighteners and leveling agents. Many of such materials are conventional additives for electroplating solutions.

There are limitations to the above process. Both the processes of the U.S. and the U.K. patents for direct electroplating require conductive surfaces in contact with the catalyzed surface for initiation and propagation of the electroplated metal deposit. For this reason, the processes are limited in their application to metal plating of nonconductive substrates in areas in close proximity to a conductive surface.

One commercial application of the process of the U.K. patent is the metallization of the walls of through holes in the manufacture of double-sided printed circuit boards by a process known as panel plating. In this application, the starting material is a printed circuit board substrate clad on both of its surfaces with copper. Holes are drilled through the printed circuit substrate at desired locations. For conductivity, the hole walls are catalyzed with a tin palladium colloid to form the required metallic sites on the surfaces of the walls of the through holes. Since the circuit board material is clad on both of its surfaces with copper and the circuit board base material is of limited thickness, the copper cladding on the surfaces of the circuit board material is separated by the thin cross section of the substrate material. The next step in the process is direct electroplating over the catalyzed hole walls. Since the copper cladding on each surface is separated by the cross section of the substrate, during electroplating, deposition initiates at the interfaces of the copper cladding and the through hole walls and rapidly propagates into the holes. The hole wall is plated to desired thickness within a reasonable period of time. Thereafter, the circuit board is finished by imaging and etching operations.

A disadvantage to the above panel plating process is that copper is electroplated over the hole wall and over the entire surface of the copper cladding. The steps following plating involve imaging with an organic coating to form a circuit pattern and removal of copper by etching. Therefore, copper is first electrolytically deposited and then removed by etching, a sequence of steps which is wasteful of plating metal, etchant and time, and therefore, more expensive.

The art has developed a method for manufacture of printed circuit boards known as pattern plating. In this process, a printed circuit board base material is drilled at desired locations to form through holes. The through holes are metallized using conventional electroless plating techniques. Electroless copper is plated onto the walls of the through holes and over the copper cladding. Thereafter, photoresist is applied and imaged to form the circuit pattern. The board is then electroplated with copper depositing on the copper conductors and through hole walls, but not over the entire surface of the copper cladding. Solder mask is then plated over the exposed copper by immersion or electroplating and the remaining photoresist is stripped. The copper not protected by the solder is then removed by etching to form the copper circuit.

Pattern plating cannot be used with the metallizing process of the aforesaid U.K. patent. The treatment of the copper cladding prior to the application of the photoresist and the development of the photoresist, all as required for pattern plating, requires the use of treatment chemicals found to dissolve or desorb the tin palladium colloid from hole walls. Since this occurs prior to electroplating, direct electroplating to provide conductive through holes becomes impossible.

U.S. Pat. No. 5,007,990 provides a new method for direct electroplating the surface of a nonconductor and to articles manufactured by said process. The process is an improvement over the process of the above-referenced U.K. patent.

The invention disclosed in the aforesaid patent is predicated upon a combination of discoveries. One discovery was that sulfide films of metals that function as electroless deposition catalysts may be electroplated directly without requiring an intermediate electroless coating. Another discovery of the invention was that many of such sulfide films are insoluble and unaffected by treatment chemicals used for plating of plastics and circuit board fabrication and therefore, the process of the invention was suitable for the formation of printed circuits using pattern plating procedures.

In the process of U.S. Pat. No. 5,007,990, the preferred electroless metal plating catalysts are the products believed to be colloids formed by reaction of a stannous salt and a noble metal salt, typically palladium. Preferred solutions for formation of sulfide films are thio compounds and divalent sulfide solutions. Consequently, the preferred coating for direct electroplating is believed to be a film of a mixed sulfide of palladium and tin.

The process of the referenced patent is an improvement over the process of the U.K. patent identified above for reasons set forth in said patent. However, in practice, it was found that the treatment of the electroless plating catalyst with a solution of a sulfur compound to form a platable sulfide coating also resulted in conversion of all metallic surfaces in contact with the sulfur containing solution to their corresponding sulfides. In printed circuit board manufacture, the starting material is often a copper clad substrate. Contact of the copper clad substrate with the solution of the sulfur compound results in the formation of copper sulfide which is a tenacious black film over the copper. The thickness of the copper sulfide film may be controlled by control of certain treatment parameters and that copper sulfide film that is formed can be removed by etching. Nonetheless, it is desirable to find a means for further controlling the process whereby the formation of the copper sulfide film is still better controlled o eliminated.

SUMMARY OF THE INVENTION

The subject invention is an improvement over the process disclosed in U.S. Pat. No. 5,007,990 in that it provides a process and composition suitable for formation of a sulfide of a noble metal-tin reaction product that may be directly electroplated with reduced formation of sulfides of other metals. The invention is in part predicated upon the discovery that increase in the tin content of a tin-noble metal electroless plating catalyst unexpectedly reduces formation of metal sulfides, such as copper sulfides, during a step of converting the tin-noble reaction product to its corresponding sulfide. In this respect, it has been discovered that increasing the tin (stannous) content of the tin-noble metal reaction product results in an inhibition in the formation of sulfides of other metals.

Accordingly, one embodiment of the invention comprises a tin-noble metal reaction product having a stannous tin content higher than that found in a conventional tin-noble metal electroless plating catalyst. Another embodiment of the invention provides a process for electroplating comprising the steps of treatment with a tin-noble metal reaction product having a high stannous tin content, treatment with a solution of a sulfur compound capable of converting the tin-noble metal reaction product adsorbed onto a substrate to its corresponding sulfide and preferably, without a step of acceleration as in conventional electroless metal plating procedures, directly electroplating the article having the tin-noble metal sulfide coating.

DESCRIPTION OF THE PREFERRED EMBODIMENTS

The subject invention is suitable for manufacture of a

The subject variety of commercial articles where a metal deposit is desired over the surface of a nonconductor. However, the invention is especially useful for the fabrication of printed circuit boards. For this reason, the description that follows is directed primarily to printed circuit board manufacture.

In the discussion that follows, the term "tin-noble metal reaction product" refers to the product formed by reaction of stannous tin with a noble metal in aqueous acid solution". The product formed is believed to be a colloid of the reduced noble metal. The term tin-noble metal electroless plating catalyst is not used for this definition because in a preferred embodiment of the invention, it is believed that the tin content is too high to permit the noble metal to function as an electroless metal plating catalyst in the absence of an aggressive step of acceleration. Moreover, even with such an acceleration step, it is believed that the composition may not function as an electroless metal plating catalyst as the step of aggressive acceleration may remove the material from the surface of the substrate.

In printed circuit board manufacture, the substrate commonly used is an epoxy substrate filled with glass fibers and copper clad on at least one of its surfaces. As is known in the art, the epoxy can be substituted or mixed with other resins for specific purposes.

In the manufacture of a double-sided printed circuit board, a first step comprises the formation of through holes by drilling or punching or any other method known to the art. Following formation of the holes, it is desirable to employ the conventional steps of desmearing the holes by sulfuric acid—permanganate mixtures, chromic acid or plasma etching or etchback of the holes with chromic acid, followed by glass etching. Thereafter, the processing sequence of the subject invention may be employed.

Following desmearing or etchback of the holes, the circuit board base material is conventionally treated with a glass etch that removes glass fibers extending into the holes from the hole walls. This is followed by a solution that cleans the copper surface and conditions the hole wall to promote catalyst adsorption. Such solutions are often referred to as cleaner conditioners and typically comprise an aqueous alkaline surfactant solution for cleaning soil and a polyamine to condition the hole wall. A suitable proprietary cleaner conditioner may be obtained from Shipley Company Inc. of Newton, Mass. and identified as Cleaner Conditioner 5100.

The next step in the processing sequence is immersion of the part in a catalyst pre-dip solution. Such solutions consist of the same medium as an electroless plating catalyst but without the colloid. The purpose is to prevent the pH and chloride concentration of the catalyst from being altered by dragging in rinse water. As with the cleaner conditioner, the catalyst pre-dip is a conventional step and does not constitute a part of the subject invention. Proprietary catalyst pre-dip compositions are commercially available and a suitable material is available from Shipley Company Inc. and identified as Cataprep ® 404 catalyst preparation.

The next step in the process comprises treatment of the part with the tin-noble metal reaction product of the invention. This composition may be formed by mixing the salts of the tin and noble metal together in acidic medium using conventional methods except for an increased stannous tin content in the preferred embodiment. The conventional means for formation of said catalyst is taught in U.S. Pat. Nos. 3,011,920, 3,874,882, and 3,904,792, each incorporated herein by reference. The method comprises reaction of a noble metal salt, halide ions and a stannous salt in aqueous acid medium at a pH not exceeding 3.5. Details of the reaction may be found in the aforesaid patents. In accordance with this invention, the increased stannous content is provided by addition of further stannous salt to a conventional tin-noble metal catalyst. A suitable proprietary catalyst that may be modified in accordance with the invention is identified as Caposit ®-44 Catalyst available from Shipley Company Inc. of Newton, Mass. The amount of noble metal in such compositions typically varies from about 0.01 to 2.5 grams per liter of the composition. For purposes herein, this concentration of the noble metal is satisfactory though a preferred concentration comprises from about 0.05 to 0.5 grams per liter and more preferably, in an amount of about 0.10 to 0.12 grams per liter. The amount of excess tin added to such tin-noble metal catalyst is an amount whereby the weight ratio of tin to noble metal (as metals) in a made up treatment composition ready for use is at least 75:1. It should be understood that the process of the invention is operable with conventional ratios used in the prior art, for example, as low as 30 to 1, but significantly improved results are obtained when the ratio is at least 75:1. Preferably, the weight ratio is within a range of from 150:1 to 700:1 and more preferably, within a range of from 300:1 to 500:1. In a further preferred embodiment of the invention, the stannous tin content is sufficiently high whereby the tin-noble metal reaction product is incapable of functioning as an electroless metal plating catalyst. The method of adding excess tin to the tin-noble metal reaction product is conventional and comprises forming a solution of stannous chloride in aqueous acid solution and adding that solution to the tin-noble metal reaction product until the desired ratio of tin to noble metal is reached.

A part is treated with the tin-noble metal reaction product of the invention by contact of the part with the reaction product for a suitable period of time. Contact can be by immersion or spray and contact time can vary from between 1 and 10 minutes. The treatment temperature may vary from room temperature to temperatures of 100° F. or more.

In accordance with the process of U.S. Pat. No. 5,007,990, the next step in the process would comprise a step of acceleration—a step comprising contact of the part with a solution capable of removing excess stannous tin and tin oxide from the surface of the part so treated. Typically, a mild acid solution is used for the acceleration step. In accordance with the process of the subject invention, the step of acceleration is preferably omitted as excess tin on the surface of the part to be plated is desired. Though not wishing to be bound by theory, it is possible that the excess tin in contact with the part including its metal surface competes with the metal surface when the part is subsequently treated with a solution of a sulfur salt. Therefore, tin sulfide is preferentially formed instead of a sulfide of the metal portion of the part to be plated. Since tin sulfide is a known electrical conductor, it also serves to enhance the electroplating reaction.

Following treatment of a part with the tin-noble metal reaction product, the tin-noble metal species adsorbed on the surface of the part to be plated is converted to a conversion coating of a tin-noble metal sulfide. Sulfide formation occurs by contact of the tin-noble metal compound with a solution of a sulfur salt capable of reacting with the tin and noble metal to form a sulfide.

The sulfur salt solution is one comprising a sulfur salt capable of reacting with tin and noble metal dissolved in a suitable solvent. Aqueous solutions are preferred. Most preferred are alkali and alkaline earth metal thio salts such as sodium thiosulfate. Alkali and alkaline earth sulfides are lesser preferred.

In accordance with the process of the invention, the sulfur salt concentration is higher than in prior art processes using sulfide conversion coatings. In accordance with the invention disclosed herein, the treatment solution preferably contains at least 25 grams per liter of the sulfur salt and more preferably, varies between about 25 and 250 grams per liter, and more preferably varies between about 75 and 200 grams per liter. In addition, the solution is preferably made alkaline with a suitable source of alkalinity such as an alkaline or alkaline earth metal carbonate. Hydroxides, such as sodium hydroxide, may be used, but are lesser preferred as highly alkaline hydroxide solutions have a tendency to strip the catalyst and or the conversion coating from the surface of the part to be plated. Preferably, the pH of the solution is in excess of 9.0 and preferably is in excess of 10.0. Though the solution may be used at ambient temperature, it is preferably used at a temperature of between 85° F. and 150° F. and more preferably, at a temperature varying between 90° F. and 125° F.

Treatment of the substrate having absorbed tin-noble metal reaction product on its surface with the sulfur salt solution results in the formation of a conversion coating suitable for direct electroplating. This conversion coating appears as a dark brown to black coating.

Following formation of the sulfide conversion coating as described above, the nonconductor may be directly electroplated. If the nonconductor is a copper clad printed circuit base material coated with the conversion coating, the copper cladding should be cleaned such as, for example, by use of a sulfuric acid—hydrogen peroxide pre-etch, for example, Microetch 5700 etchant available from Shipley Company Inc. of Newton, Mass. to which an organic acid is added. Typically, sulfuric acid—hydrogen peroxide etchants contain from about 5 to 20 percent by volume sulfuric acid and 2 to 15 percent by volume hydrogen peroxide. Preferred organic acids are those that are monobasic—i.e., having a single carboxyl group. Suitable acids include acetic acid, formic acid, butyric acid and adipic acid. The acid is added in an amount of from 5 to 25 percent by volume of solution and more preferably from 10 to 20 percent by volume. The etchant may be used at a temperature ranging from room temperature up to about 125° F. or higher for a period of time ranging between 1 and 3 minutes. It should be noted that unexpectedly, treatment with the etchant does not result in attack upon the conversion coating of the invention.

The electroplating procedure used is similar to the procedure disclosed in the above referenced U.K. patent, but careful control of the electroplating parameters as required by the process of the U.K. patent is not necessary in the process of this invention. The electroplating process may use electroplating solutions such as those disclosed in the U.K. patent, but most commercially available electroplating solutions contain additives which make most commercially available electroplating solutions suitable for the process of the invention. The preferred electroplating metals in accordance with the invention are copper and nickel though the process is suitable for electroplating of any desired metal. A typical electroplating solution comprises an aqueous acid solution of the metal desired to be plated together with proprietary additives from the group of dyes, surfactants, chelating agents, brighteners, leveling agents, etc. Typical acids used in the formulation of said bath comprise those with a high ionic dissociation constant for maximum conductivity such as sulfuric acid, fluoroboric acid, sulfamic acid, etc. Dyes typically used in such baths include methylene blue, methyl violet, and other N-heterocyclic compounds; triphenylmethane type dyes and aromatic imines and diazo compounds. Suitable surfactants included in such baths typically include non-ionic surfactants such as alkylphenoxy polyethoxyethanols, e.g., octophenoxy, polyethoxyethanol etc. Surfactants include wetting agents and water soluble organic compounds such as compounds containing multiple oxyethylene groups. A preferred group of said compounds include poly- oxyethylene polymers having from as many as 20 to 150 repeating units. Also included in this class of materials are black copolymers or polyoxyethylene and polyoxypropylene. The additives described above are added to solution in conventional concentrations.

The electroplating procedure is conventional. The part to be plated is used as a cathode in a conventional electroplating cell. Current density is conventional and varies typically within a range of from 10 through 40 amps per ft$^2$. Theoretically, in accordance with the teachings of the prior art relating to alternative electroplating processes, a low initial current density should be preferred with current density increased as an initial deposit is formed. This would be expected to prevent burn off of the thin conversion coating. However, unexpectedly, in the practice of the process of the subject invention, adverse results caused by a high initial current density have not been observed. A preferred current density range is from 15 to 30 amps per ft$^2$. The plating solution is maintained at a temperature ranging between room temperature and about 100° F. Plating is continued for a time sufficient to form a deposit of desired thickness. For circuit board manufacture, a desired thickness may range between 0.5 and 2.0 mils, typically from 1 to 1.5 mils. A plating time of from 30 to 90 minutes would typically be required to obtain a deposit of the preferred thickness within the preferred range of current densities. The deposit formed by the process is uniform in thickness, free of defects and strongly bonded to the surface of the nonconductor over which it is plated. Bond strength is satisfactory to withstand solder shock testing as conventionally used in printed circuit board manufacture.

The chemical resistance of the tin-noble metal sulfide conversion coating to treatment solutions permits simplified printed circuit board manufacturing processes impractical or inoperative in the prior art. For example, a pattern plating sequence, as described above, could not be used with the direct electroplating process of the U.K. Patent because the pretreatment steps would remove or dissolve adsorbed colloid thereby making it impossible to first treat and image and then electroplate. This is a serious disadvantage because it severely limits the type of circuit board that can be fabricated using the process of the U.K. Patent. The conversion coating of the subject invention remains unaffected when contacted with treatment chemicals required for pattern plating. Therefore, a pattern plating process for formation of printed circuit boards is possible using the process of the subject invention. Such a process is illustrated in the sequences of steps described below using a predrilled and desmeared copper clad circuit board base material:

| | Pattern Plating Sequence |
|---|---|
| Step 1 | Clean and condition; |
| Step 2 | Catalyst pre-dip; |
| Step 3 | Catalyze; |
| Step 4 | Treat with sulfur salt solution; |
| Step 5 | Clean copper cladding of conversion coating; |
| Step 6 | Apply and image photoresist; |
| Step 7 | Develop photoresist image; |
| Step 8 | Clean and then microetch copper cladding; |
| Step 9 | Electroplate; |
| Step 10 | Apply solder resist; |
| Step 11 | Remove remaining photoresist; |
| Step 12 | Remove copper bared by removal of photoresist. |

Step 4 above results in the formation of the sulfide conversion coating of the invention. Pattern plating is possible in accordance with the invention because the etchants and alkaline developers used to develop the photoresist layer do not adversely effect or inactivate the sulfide conversion coating. These same materials would inactivate, desorb or dissolve the palladium tin colloidal coating used for direct electroplating in the process of the U.K. Patent.

The invention will be better understood by reference to the Examples which follow where, unless stated otherwise, the substrate treated was an epoxy copper clad circuit board base material provided with a random array of through holes. Commercial formulations used in the Examples are available from Shipley Company Inc. of Newton, Mass.

EXAMPLE 1

The following compositions were prepared:

| Formulation I | |
|---|---|
| Palladium chloride | 0.12 gm/l |
| Stannous chloride | 4.32 gm/l |
| Potassium chloride | 0.26 gm/l |
| Hydrochloric acid | 5.82 ml/l |
| Water | to 1 liter |
| Formulation II | |

-continued

| | |
|---|---|
| Sodium thiosulfate | variable |
| Sodium carbonate | to pH 10.5 |
| Water | to 1 liter |

In the above formulation I, the stannous chloride reacted with the palladium chloride to provide a colloidal formulation. Twenty grams per liter of stannous chloride were added to the above formulation to provide a composition having a ratio of tin (expressed as metal) to palladium (expressed as metal) of about 130 to 1.

Five circuit board substrate materials were subjected to the following procedure.

Step 1 Pre-clean and condition:

a. desmear the hole walls with a solvent for the epoxy by immersion in a solvent solution maintained at 160° F. for 5 minutes, water rinse and immerse in a potassium permanganate at a temperature of 160° F. for 7 minutes and water rinse;

b. neutralize permanganate residues by immersion in a peroxide-sulfuric acid solution maintained at ambient temperature for 2.5 minutes and water rinse;

c. clean and condition the copper cladding and hole walls using an alkaline based solution containing proprietary surfactants identified as Sensitizer 5100 maintained at 15% strength at a temperature of 110° F. for 5 minutes and water rinse.

Step 2 Catalyze:

a. immerse the substrate in an acidic sodium chloride solution identified as Cataprep ® 404 at a temperature of 70° F. for 1 minute and water rinse.;

b. immerse the substrate in Formulation I at a temperature of 115° F. for 5 minutes and water rinse.

Step 3 Form conversion coating:

Immerse in Formulation II maintained at room temperature except for Example 4 where Formulation II was used at a temperature of 140° F. For each example, immersion was for a period of 5 minutes and was followed by a water rinse.

The concentration of the thiosulfate in Formulation II and the results obtained are set forth in the following table:

TABLE 1

| Example Number | Thiosulfate Conc. (gm/l) | Conversion Coating Appearance |
|---|---|---|
| 1 | 16 | Thin brown film. |
| 2 | 80 | " |
| 3 | 160 | " |
| 4 | 160 | Thin dark brown film. |

The boards prepared in accordance with Steps 1 to 3 and having a platable conversion coating were further treated by the following sequence of steps:

Step 4 Remove conversion coating from copper:

Immerse the coated board in a peroxide sulfuric etchant identified as Microetch 5700 etchant to which is added 10 percent by volume acetic acid at a temperature of 100° F. for 1.5 minutes and water rinse.

Step 5 Electroplate:

Electroplate copper from an acid copper electroplating bath identified as Electroposit ® 1000 acid copper at a current density of 30 amps/sq. ft. and at a temperature of 70° F. for 30 minutes and water rinse.

Treatment of the so treated boards having the conversion coating with the peroxide etchant (Step 4) resulted in particles of precipitate floating to the surface of the solution and thereafter dissolving in the solution. The origin of this material is the film on the copper surface. The conversion coating can be seen lifting off the copper surfaces when the board is immersed in the solution. In Examples 1 to 3, using the room temperature solution of the thio compound, some film was retained on the copper. All of the film was removed from the part treated with the solution of Example 4 indicating that temperature is significant to formation of the conversion coating. Further, in Examples 1 to 3, complete coverage during the electroplating step took at least 15 minutes. Using the procedure of Example 4, complete coverage occurred within 1 minute further illustrating the importance of driving the reaction by treatment at an elevated temperature.

Example 4 constitutes the most preferred embodiment of the direct electroplating process of the invention.

EXAMPLES 5 to 7

The procedure of Example 4 was repeated substituting formic acid, butyric acid or adipic acid for acetic acid in Step 4. Similar results were obtained.

EXAMPLE 8

This example demonstrates a process for panel plating. Boards were prepared following the procedures defined in steps 1 through 4 above following the procedures of Example 4. Thereafter, the boards are treated in accordance with the following process sequence:

Step 5 Apply and image photoresist:

a. dry the cleaned boards;

b. apply a dry film of Riston ®3015 photoresist (available from E. I. DuPont de Nemours and Company of Wilmington, Delaware) at an application temperature of between 98° and 110° C. and at a speed of from 1 to 3 ft/min. and wait 15 minutes following application of the film; and c. expose the film to a source of activating energy to obtain the desired circuit pattern at an exposure of 40 mJ/cm and then wait 15 minutes.

Step 6 Develop imaged photoresist:

Place the imaged board in a spray chamber using a solution consisting of 5 pounds of sodium carbonate and 1 gallon of butyl carbitol per 60 gallons and develop at a temperature of 85° F. for 1 minute.

Step 7 Electroplate solder:

Immerse the substrate in a tin/lead fluoroborate plating solution identified as Electroposit 280 Tin/Lead at a temperature of 85° F. using a cathode current density of between 10 and 40 amps/sq. ft. for 60 minutes.

Step 8 Remove photoresist:

Spray the board with a 2% potassium hydroxide solution at a temperature of 85° F. for 1 minute.

Step 9 Etch copper:

Spray the board with an ammoniacal copper etchant at 110° F. until all of the exposed copper is removed.

Copper coverage over all surfaces including through holes was excellent.

EXAMPLE 9

The following example demonstrates a process for pattern plating in the formation of a printed circuit board using the process of the invention.

Boards were prepared following the procedures defined in steps 1 through 4 of Example 4. Following removal of conversion coating from copper surfaces, the following steps were followed:

Step 5 Apply and image photoresist:
  a. dry the cleaned boards;
  b. apply a dry film of Riston ® 3015 photoresist available from E. I. DuPont de Nemours and Company of Wilmington, Delaware at an application temperature of between 98 and 110° C. and at a speed of from 1 to 3 ft/min. and wait 15 minutes following application of the film; and
  c. expose the photoresist film to a source of activating energy through a master to obtain the desired circuit pattern at an exposure of 40 mJ/cm and wait 15 minutes.

Step 6 Develop the photoresist:
Place the substrate in a spray chamber using a solution consisting of 5 pounds of sodium carbonate and 1 gallon of butyl carbitol per 60 gallons of developer and develop at a temperature of 85° F. for 1 minute.

Step 7 Clean copper:
Immerse the sulfide coated board in Acid Cleaner 811 at 110° F. for 1 minute and water rinse.

Step 8 Microetch copper surfaces:
Immerse the board in a peroxide sulfuric acid etchant at a temperature of 70° F. for 1 minute and water rinse.

Step 9 Electroplate
Electroplate copper from an acid copper electroplating bath identified as Electroposit ® 1000 acid copper at a current density of 30 amps/sq. ft. and at a temperature of 70° F. for 30 minutes and water rinse.

Step 10 Electroplate solder:
Immerse the developed board in a tin/lead fluoroborate plating solution identified as Electroposit 280 Tin/Lead at a temperature of 85° F. using a cathode current density of between 10 and 40 amps/sq. ft. for 60 minutes.

Step 11 Remove photoresist:
Spray the board with a 2% potassium hydroxide at a temperature of 85° F. for 1 minute.

Step 12 Etch copper surfaces:
Spray the board with an ammoniacal copper etchant at 110° F. until all of the exposed copper is removed.

I claim:

1. A process for preparing a nonconducting surface for plating, said process comprising the steps of contact of said nonconductor with an aqueous composition comprising the product of reaction of a stannous salt, a noble metal salt and halide ions in acidic solution having a pH not exceeding 3.5 where the noble metal salt is present in an amount varying between 0.01 and 2.5 grams per liter and the weight ratio of total tin to total noble metal, expressed as metal, is at least 150 to 1 and then contacting said surface with a solution of a sulfur salt capable of reaction with said reaction product to form a sulfide.

2. The process of claim 1 where the ratio of tin to noble metal varies between 150 to 1 to 700 to 1.

3. The process of claim 1 where the ratio of tin to noble metal varies between 200 to 1 to 500 to 1.

4. The process of claim 1 where the tin content is sufficiently high whereby the composition is incapable of functioning as an electroless metal plating catalyst.

5. The process of claim 1 where the process is characterized by the absence of a step of acceleration between the steps of contact with the solution of said reaction product and the solution of said sulfur salt.

6. The process of claim 1 where the noble metal is palladium and, the halide ions are chloride.

7. The process of claim 6 where the concentration of palladium varies between 0.1 and 1.0 grams per liter.

8. The process of claim 2 where the sulfur salt is a thio compound.

9. The process of claim 1 where the solution of a sulfur compound is used at an elevated temperature.

10. The process of claim 9 where the temperature is in excess of 100° F.

11. A process for electroplating a nonconducting surface, said process comprising the steps of contact of said nonconductor with an aqueous composition comprising the product of reaction of a stannous salt, a noble metal salt and halide ions in acidic solution having a pH not exceeding 3.5 where the noble metal salt is present in an amount varying between 0.01 and 2.5 grams per liter and the weight ratio of total tin to total noble metal, expressed as metal, is at least 150 to 1, contacting said surface with a solution of a sulfur salt capable of reaction with said reaction product to form a sulfide and electroplating said surface.

12. The process of claim 11 where the ratio of tin to noble metal varies between 150 to 1 to 700 to 1.

13. The process of claim 11 where the ratio of tin to noble metal varies between 200 to 1 to 500 to 1.

14. The process of claim 11 where the tin content is sufficiently high whereby the composition is incapable of functioning as an electroless metal plating catalyst.

15. The process of claim 16 where the process is characterized by the absence of a step of acceleration between the steps of contact with the solution of said reaction product and the solution of said sulfur salt.

16. The process of claim 11 where the noble metal is palladium and, the halide ions are chloride.

17. The process of claim 16 where the concentration of palladium varies between 0.1 and 1.0 grams per liter.

18. The process of claim 11 where the sulfur salt is a thio compound.

19. The process of claim 11 where the solution of a sulfur compound is used at an elevated temperature.

20. The process of claim 11 where the temperature is in excess of 100 ® F.

21. The process of claim 11 where the electroplating solution is an electrolytic copper solution.

22. The process of claim 11 including a step of contact of the substrate with a solvent for the noble metal tin sulfide between the steps of treatment with the sulfur containing solution and electroplating.

23. The process of claim 22 where the solvent is a sulfuric acid peroxide solution.

24. The process of claim 22 where the solution contains an organic acid.

25. The process of claim 24 where the organic acid has a single carboxylic acid group in an amount of from 5 to 25 percent by volume.

* * * * *